US011333630B2

(12) United States Patent
Pearson et al.

(10) Patent No.: US 11,333,630 B2
(45) Date of Patent: May 17, 2022

(54) WAVEFORM GENERATOR, SYSTEM AND METHOD

(71) Applicants: OWLSTONE MEDICAL LIMITED, Cambridge (GB); OWLSTONE INC., Norwalk, CT (US)

(72) Inventors: Jonathan Pearson, Cambridge (GB); Antoni Negri, Cambridge (GB)

(73) Assignees: OWLSTONE MEDCIAL LIMITED, Cambridge (GB); OWLSTONE INC., Westport, CT (US)

( * ) Notice: Subject to any disclaimer, the term of this patent is extended or adjusted under 35 U.S.C. 154(b) by 162 days.

(21) Appl. No.: 16/631,562

(22) PCT Filed: Jul. 16, 2018

(86) PCT No.: PCT/GB2018/052014
§ 371 (c)(1),
(2) Date: Jan. 16, 2020

(87) PCT Pub. No.: WO2019/016530
PCT Pub. Date: Jan. 24, 2019

(65) Prior Publication Data
US 2020/0173962 A1 Jun. 4, 2020

(30) Foreign Application Priority Data
Jul. 18, 2017 (GB) .................................. 1711530

(51) Int. Cl.
*H03K 3/57* (2006.01)
*G01N 27/624* (2021.01)
(Continued)

(52) U.S. Cl.
CPC ............. *G01N 27/624* (2013.01); *G05F 3/08* (2013.01); *H03K 3/57* (2013.01); *H03K 17/687* (2013.01)

(58) Field of Classification Search
CPC ...... G01N 27/624; G05F 3/08; H03K 17/687; H03K 3/57; H03K 3/53
See application file for complete search history.

(56) References Cited

U.S. PATENT DOCUMENTS

2009/0274185 A1* 11/2009 Champion .............. H01S 5/042
372/38.02
2016/0336159 A1 11/2016 Toutoungi et al.
2016/0380621 A1* 12/2016 Hiley ....................... H03H 7/38
327/111

FOREIGN PATENT DOCUMENTS

WO 2013171488 A1 11/2013

OTHER PUBLICATIONS

European Patent Office, International Search Report and Written Opinion, PCT/GB2018/052014, dated Jun. 11, 2018.
(Continued)

*Primary Examiner* — Sibin Chen
(74) *Attorney, Agent, or Firm* — Leveque Intellectual Property Law, PC

(57) ABSTRACT

A waveform generator configured to generate two waveforms of opposite polarity so as to provide a voltage gain across a load. The waveform generator has a primary side circuit comprising a first inductor. The waveform generator has a secondary side circuit comprising a second inductor, a first output region conductively coupled to the load, and a second output region conductively coupled to the load. The second inductor is inductively coupled to the first inductor. The first inductor is conductively coupled to the first output region so as to supply a first of the two waveforms to the load. The second inductor is conductively coupled to the second output region so as to supply a second of the two waveforms to the load. A system incorporating the waveform generator and a method of driving the waveform generator are also provided.

23 Claims, 9 Drawing Sheets

(51) Int. Cl.
*G05F 3/08* (2006.01)
*H03K 17/687* (2006.01)

(56) References Cited

OTHER PUBLICATIONS

UK Intellectual Property Office, Search Report under Section 17(5), GB1711530.4, dated Jan. 17, 2018.

\* cited by examiner

WAVEFORM GENERATOR, SYSTEM AND METHOD

BACKGROUND

The present invention is directed towards a waveform generator, system and method. In particular, the present invention is directed towards a waveform generator configured to generate two waveforms of opposite polarity so as to provide a voltage gain across a load, a system incorporating the waveform generator, and a method of driving the waveform generator.

Referring to FIG. 1, there is shown a known waveform generator indicated generally by the reference numeral 100. The waveform generator 100 is an asymmetric waveform generator 100 and includes a Field Effect Transistor (FET) 105 connected to a primary winding 101 of a transformer. The transformer has two secondary windings 103, 104 conductively coupled together and to ground G. The two secondary windings 103, 104 are inductively coupled to the primary winding 101 of the transformer. The transformer is configured to deliver two waveforms 113, 114 of opposite polarity for providing a waveform voltage gain. In more detail, a DC voltage source 109 applies a DC voltage to the primary winding 101, and a drive signal switches the FET between ON and OFF states so as to generate a waveform 111 at the primary winding side. The inductive coupling between the primary winding 101 and the two secondary windings 103, 104 results in two waveforms 113, 114 of opposite polarity being generated at the secondary winding side. The two waveforms 113, 114 are supplied across a load 107. As a result of the opposite polarity of the two waveforms 113, 114, the two waveforms 113, 114 provide a voltage gain across the load 107.

An application of this existing waveform generator 100 is disclose in United States Patent Application Publication No. 2016/336159. In this existing application, the waveform voltage gain is applied across an ion filter device.

While the known waveform generator has been successful, it is desirable to improve the performance of waveform generators at high frequencies and voltages. It is desirable to reduce the effects of parasitic capacitance on waveform generators. It is desirable to improve the frequency range within which the waveform generators may effectively operate.

SUMMARY

It is an objective of the present invention to provide a waveform generator with improved performance, or at least to provide an alternative waveform generator.

According to the present invention there is provided an apparatus and method as set forth in the appended claims. Other features of the invention will be apparent from the dependent claims, and the description which follows.

According to a first aspect, there is provided a waveform generator configured to generate two waveforms of opposite polarity so as to provide a voltage gain across a load, the waveform generator comprising: a primary side circuit comprising a first inductor, and a secondary side circuit comprising a second inductor arranged to be inductively coupled to the first inductor, a first output region conductively coupled to the load and a second output region conductively coupled to the load, wherein the first inductor is arranged to be conductively coupled to the first output region so as to supply a first of the two waveforms to the load, and wherein the second inductor is arranged to be conductively coupled to the second output region so as to supply a second of the two waveforms to the load.

Here, "voltage gain across a load" means that the amplitude of the voltage supplied across the load is larger than the voltage supplied to the waveform generator. The voltage supplied across the load may be between 6 and 8 times as large as the voltage supplied to the waveform generator.

Here, an element being "conductively coupled" to another element means that electrical energy may be transferred between the two elements by means of physical contact via a conductive medium. Conductive coupling contrasts with inductive coupling and capacitive coupling. The conductive coupling may be provided by a wire, resistor, common terminal or metallic bonding, for example.

Here, an element being "inductively coupled" to another element means that a change in current in one element induces a voltage across the other element through electromagnetic induction.

The waveform generator of the first aspect has a first inductor conductively coupled to the first output region of the secondary side circuit, and a second inductor conductively coupled to the second output region, and at the same time the first inductor and the second inductor are inductively coupled to one another. This contrasts with the existing waveform generator where there is only an inductive coupling between the primary side circuit and the secondary side circuit.

The conductive coupling of the first inductor to the first output region of the secondary side circuit means that there is a current path between the first inductor and the load. This means that current may flow directly from the first inductor to the load via the first output region.

Surprisingly, by conductively coupling the first inductor to the first output region of the secondary side circuit, the waveform generator of the first aspect has been found to reliably produce stable, high voltage waveforms at high frequencies. It has been found that the waveform generator of the first aspect can produce sharp transitions between the troughs and the peaks of the waveforms. In addition, it has been found that the waveform generator of the first aspect has reduced ringing effects. It has also been found that the waveform generator of the first aspect is able to operate effectively over a range of frequencies.

Further advantageously, the waveform generator of the first aspect has a simple design because multiple secondary windings are not required. In addition, the waveform generator of the first aspect is understood to have limited parasitic effects, and so is able to operate at low power. The waveform generator may be portable/battery powered.

The two waveforms may be continuous waveforms both having the same predetermined frequency.

The two waveforms may be supplied to the load at substantially the same time.

The two waveforms may have a frequency of between 10 and 50 MHz. The two waveforms may have a frequency of between 15 to 30 MHz. The two waveforms may have a frequency of 23 MHz.

The two waveforms may have a peak voltage with a magnitude of between 0.5 and 1500V. The two waveforms may have a peak voltage of between 100 and 500 V. This means that a peak voltage of between 200 and 1000V may be applied across the load. The two waveforms may have a peak voltage with a magnitude of between 175 and 250 V. The two waveforms may have a peak voltage that is selected based on the desired voltage to be supplied to the load.

The two waveforms have a duty cycle of less than 50%. This means that the generated waveforms are asymmetric. The two waveforms may have a duty cycle of between 20 to 40%. The duty cycle may be selected based on the desired duty cycle to be supplied to the load.

A first terminal of the first inductor may be conductively coupled to a DC voltage source. A second terminal of the first inductor may be conductively coupled to the first output region. In this way, a current path may be formed from the second terminal of the first inductor to the load via the first output region. Current may flow directly from the first inductor to the load via the first output region.

The waveform generator may further comprise a switch conductively coupled to the second terminal of the first inductor. The switch may be arranged to be activated by a drive signal so as to control the generation of the two waveforms.

The switch may be a Field Effect Transistor (FET). The second terminal of the first inductor may be conductively coupled to the drain of the FET. The gate of the FET may be arranged to receive the drive signal. The source of the FET may be conductively coupled to ground.

The waveform generator may further comprise a controller arranged to supply the drive signal to the switch so as to control the generation of the two waveforms.

The waveform generator may be arranged to generate the two waveforms as a result of the switch transitioning from an ON state to an OFF state.

A first terminal of the second inductor may be conductively coupled to the second output region. A second terminal of the second inductor may be conductively coupled to ground. In this way, a current path may be formed between the first terminal of the second inductor and the load via the second output region. Current may flow directly from the second inductor to the load via the second output region.

The load may comprise a first terminal and a second terminal. The second output region may be arranged to be conductively coupled to the first terminal of the load. The first output region may be arranged to be conductively coupled to the second terminal of the load.

The first terminal of the load may comprise a first electrode. The second terminal of the load may comprise a second electrode.

The second output region may comprise a third inductor. The second inductor may be coupled or conductively coupled to the third inductor. The second inductor and third inductor may be coupled or conductively coupled together in series. The third inductor may be coupled or conductively coupled to the load. The third inductor may have a first terminal coupled or conductively coupled to the first terminal of the second inductor. The third inductor may have a second terminal coupled or conductively coupled to the load. The second terminal of the third inductor may be coupled or conductively coupled to the first terminal of the load.

The first output region may comprise a fourth inductor. The first inductor may be coupled or conductively coupled to the fourth inductor. The first inductor and fourth inductor may be coupled or conductively coupled together in series. The fourth inductor may be coupled or conductively coupled to the load. The fourth inductor may have a first terminal coupled or conductively coupled to second terminal of the first inductor. The fourth inductor may have a second terminal coupled or conductively coupled to the load. The fourth inductor may have a second terminal coupled or conductively coupled to the second terminal of the load.

The load may be an ion filter device.

The ion filter device may be a Field Asymmetric Ion Mobility Spectrometer (FAIMS).

The first inductor and the second inductor may be arranged such that when a voltage of a first polarity is applied across the first inductor, a voltage of the same polarity to the first polarity is induced in the second inductor.

The first inductor and/or the second inductor may comprise non-magnetic, thermally conductive coil formers. The non-magnetic, thermally conductive coil former may help reduce generation of heat in the waveform generator and improve manufacturing tolerance. The coil former may be threaded to ensure that the coil is placed in the same place each time it is wound. The coil former may be connected to one or more other heat sink components. This means that the waveform generator may be cooled via a direct cooling method, such as a single fan.

The first inductor and the second inductor may have a windings ratio of 1:1.

According to a second aspect, there is provided a system comprising: a load; and a waveform generator as claimed in any preceding claim configured to generate two waveforms of opposite polarity so as to provide a voltage gain across the load.

According to a third aspect, there is provided a method of driving a waveform generator as described in relation to the first aspect, the method comprising: supplying a drive signal to the primary side circuit; and applying a DC voltage across the first inductor.

Applying the DC voltage across the first inductor may comprise increasing the DC voltage in increments from a starting DC voltage to a target DC voltage.

Increasing the DC voltage in increments may comprise increasing the DC voltage in increments during a number of cycles until the target DC voltage is reached. In each cycle, the DC voltage may be increased in increments from an initial DC voltage to a final DC voltage. The initial DC voltage and the final DC voltage may be increased after each cycle.

BRIEF DESCRIPTION OF THE DRAWINGS

For a better understanding of the invention, and to show how embodiments of the same may be carried into effect, reference will now be made, by way of example only, to the accompanying diagrammatic drawings in which:

FIG. 13 is a schematic diagram of an example load that the waveform generator of the first aspect is arranged to supply waveforms to;

DETAILED DESCRIPTION

Figure 1:
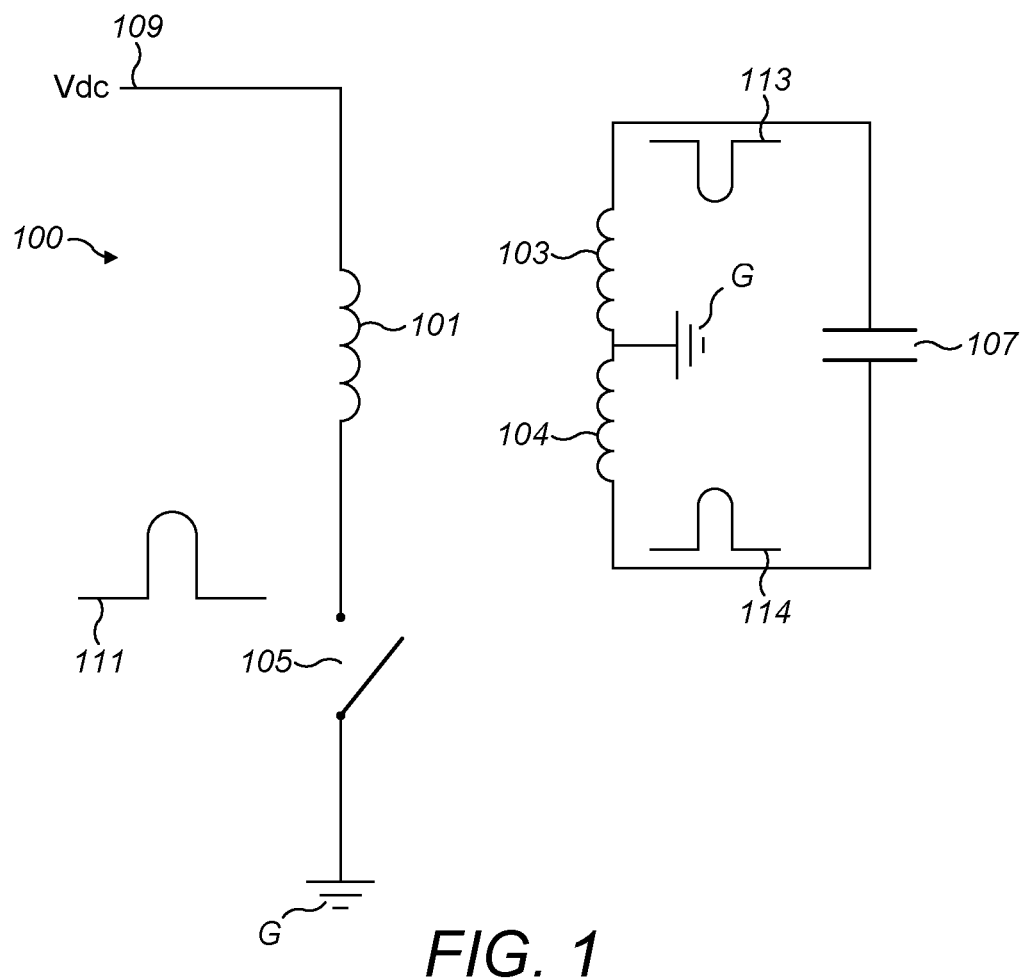
FIG. 1 is a schematic diagram of an existing waveform generator.
Figure 2:
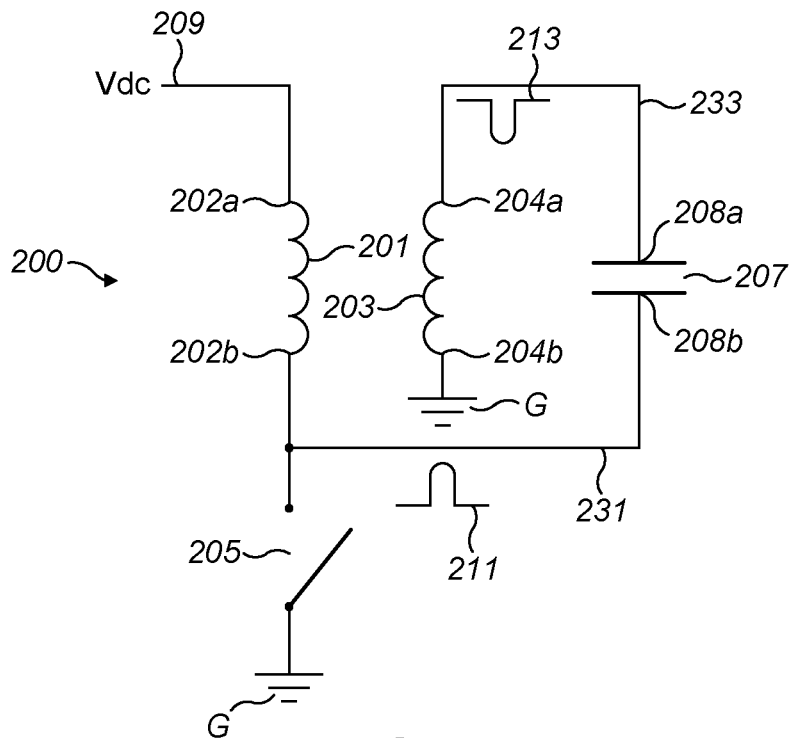
FIG. 2 is a schematic diagram of an example waveform generator according to the first aspect.

Referring to FIG. 2, there is shown a waveform generator according to the first aspect and indicated generally by the reference numeral 200. The waveform generator 200 is configured to generate two waveforms 211, 213 of opposite polarity so as to provide a voltage gain across the load 207.

The waveform generator 200 comprises a primary side circuit comprising a first inductor 201.

The waveform generator 200 comprises a secondary side circuit comprising a second inductor 203, a first output region 231 conductively coupled to the load 207 and a second output region 233 conductively coupled to the load 207. The second inductor 203 is arranged to be inductively coupled to the first inductor 201. That is, the second inductor 203 is positioned in proximity to the first inductor 201 such that there is an inductive coupling between the first and second inductors 201, 203.

The first inductor 201 is conductively coupled to the first output region 231 so as to supply a first 211 of the two waveforms 211, 213 to the load 207. The second inductor 203 is conductively coupled to the second output region 233 so as to supply a second 213 of the two waveforms 211, 213 to the load 207. The first and second output regions 231, 233 in this example are conductive wires that are conductively coupled to the load 207. In this example, the first inductor 201 and the second inductor 203 are both conductively coupled to the load 207 via the first and second output regions 231, 233.

In the example shown in FIG. 2, the first waveform 211 is shown as having a peak voltage with a positive polarity. The second waveform 213 is shown as having a peak voltage with a negative polarity. Across the load 207, the two waveforms 211, 213 additively combine to supply a peak voltage to the load 207 which is the sum of the magnitude of the peak voltages for the two waveforms 211, 213. For example, if the peak voltage of the first waveform 211 is +250V and the peak voltage of the second waveform 213 is −250V, the two waveforms 211, 213 additively combine to produce a peak voltage of +500V across the load 207.

The first terminal 202a of the first inductor 201 is conductively coupled to a DC voltage source 209. The second terminal 202b of the first inductor 201 is conductively coupled to the first output region 231 which is in turn conductively coupled to the load 207. In addition, the second terminal 202b of the first inductor 201 is conductively coupled to a switch 205. The second terminal 202b of the first inductor 201 is conductively coupled to one terminal of the switch 205, and another terminal of the switch 205 is conductively coupled to ground G.

The switch 205 is activated by a drive signal which means that the switch 205 transitions between ON and OFF states depending on the drive signal.

The switch 205 being activated by the drive signal controls the generation of the two waveforms 201, 203. In particular, when the switch 205 is in the ON state, current flows through the first inductor 201. When the switch 205 transitions to the OFF state, a voltage rises across the first inductor 201. The first inductor 201 and the second inductor 203 are arranged such that when a voltage of a first polarity is applied across the first inductor 201, a voltage of the same polarity is induced in the second inductor 203. As a result, the voltage rising across the first inductor 201 causes a voltage having the same polarity to be induced in the second inductor 203.

The waveform generator 200 may further comprise a controller (not shown) that is arranged to supply the drive signal to the switch 205 so as to control the generation of the two waveforms 211, 213.

The first terminal 204a of the second inductor 203 is conductively coupled to the second output region 233 which is in turn conductively coupled to the load 207. The second terminal 204b of the second inductor 203 is conductively coupled to ground G.

The load 207 comprises a first terminal 208a and a second terminal 208b. The first terminal 208a comprises a first electrode 208a, and the second terminal 208b comprises a second electrode 208b. The first terminal 208a of the load 207 is conductively coupled to the second output region 233 which is in turn conductively coupled to the first terminal 204a of the second inductor 203. The second terminal 208b of the load 207 is conductively coupled to the first output region 231 which is in turn conductively coupled to the second terminal 202b of the first inductor 201.

Figure 3:
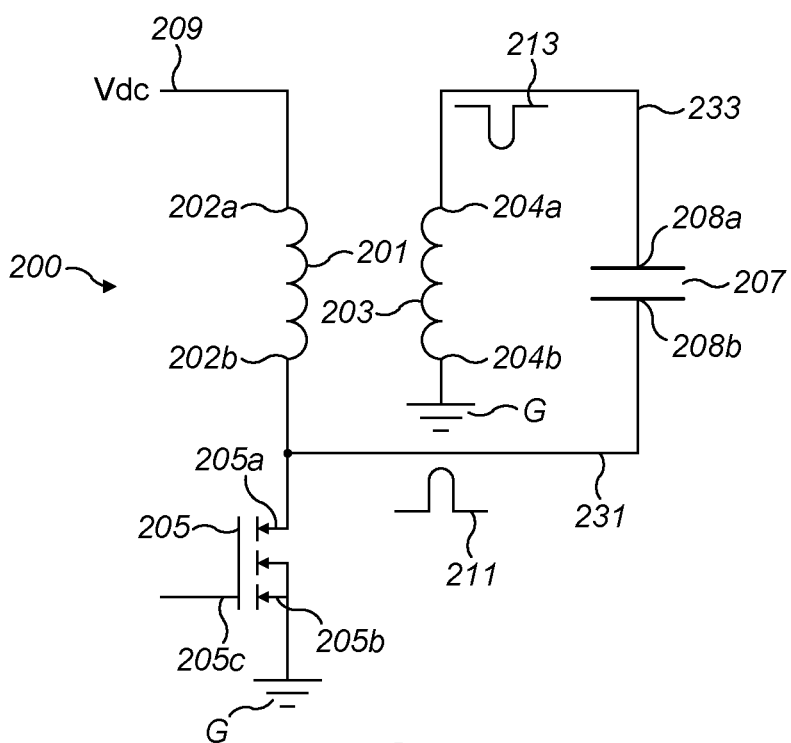
FIG. 3 is a schematic diagram of another example waveform generator according to the first aspect.

Referring to FIG. 3, there is shown another example of the waveform generator 200 according to the first aspect. In this example, the switch 205 is a Field Effect Transistor (FET) 205, and in particular is a Metal Oxide Semiconductor FET (MOSFET) 205. The second terminal 202b of the first inductor 201 is conductively coupled to the drain 205a of the MOSFET 205. The source 205b of the MOSFET 205 is conductively coupled to the ground G. The gate 205c of the MOSFET 205 is arranged to receive the drive signal. The other components of the waveform generator 200 of FIG. 3 are the same as the waveform generator 200 of FIG. 2. The same reference numerals have been used in FIG. 3.

Referring to FIGS. 4 to 8 there are shown the results of a simulation of the waveform generator 200 according to FIG. 3. It will be appreciated that these figures show just an example simulation and are just used to highlight an advantageous operation of the waveform generator 200. In this example simulation, the drive signal applied to the gate 205c of the MOSFET 205 had a frequency of 25 MHz, a duty cycle of 20%, and a peak voltage of 7V. The DC voltage 209 supplied to the first inductor 201 has a value of 60V.

Figure 4:
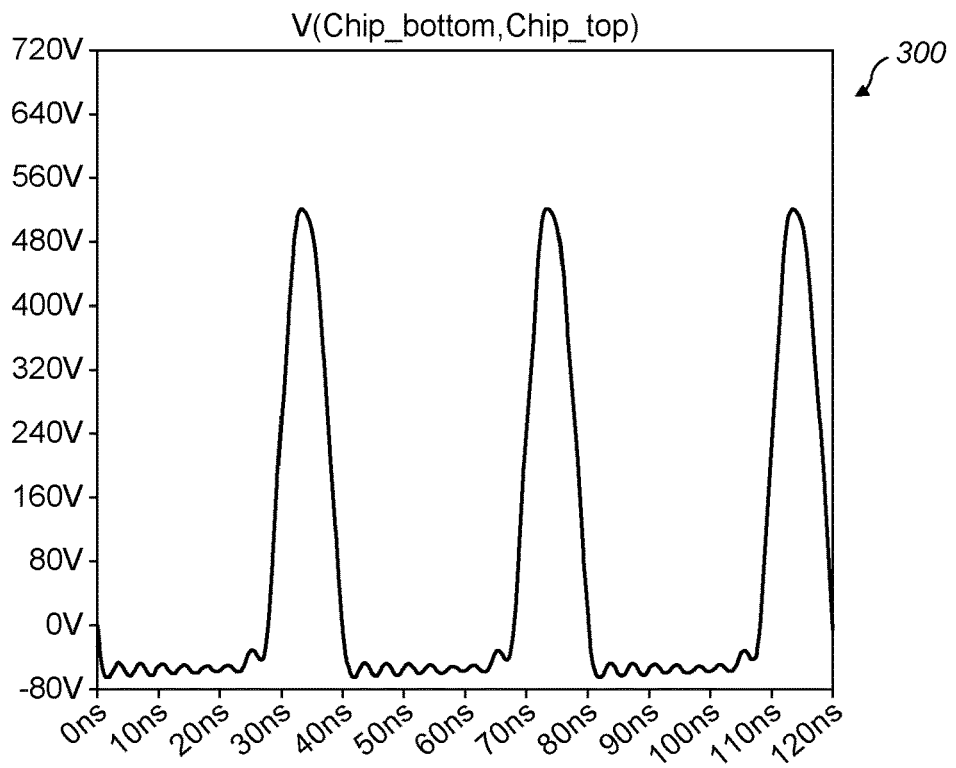
FIGS. 4 to 8 are plots showing example simulation results of the waveform generator according to FIG. 3.

Referring to FIG. 4, there is shown a plot 300 of the voltage waveform applied across the load 207 as a result of the two waveforms 211, 213. The voltage waveform has peaks of approximately 530V and troughs of approximately −60V. It will be appreciated that a high, stable, voltage waveform has been generated at a high frequency.

Figure 5:
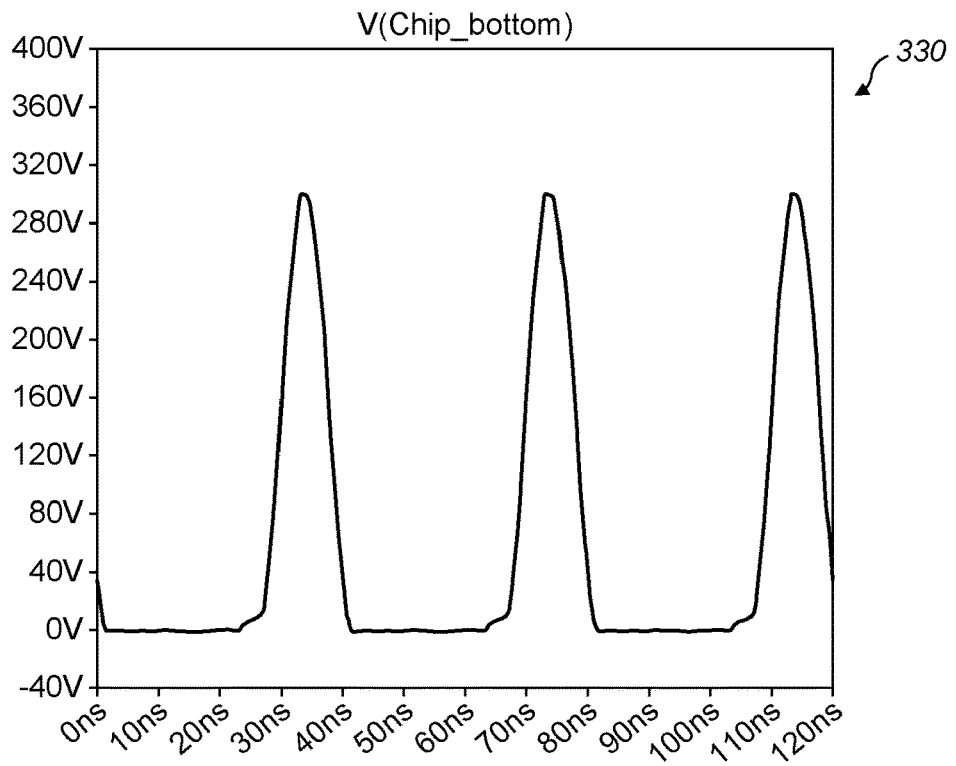

Referring to FIG. 5, there is shown a plot 330 of the first waveform 211 that is supplied to the second terminal 208b of the load 207. The first waveform 211 has peaks of approximately 300V. The peaks in the first waveform 211 correspond with the peaks in the voltage waveform applied across the load 207 as shown in FIG. 4.

Figure 6:
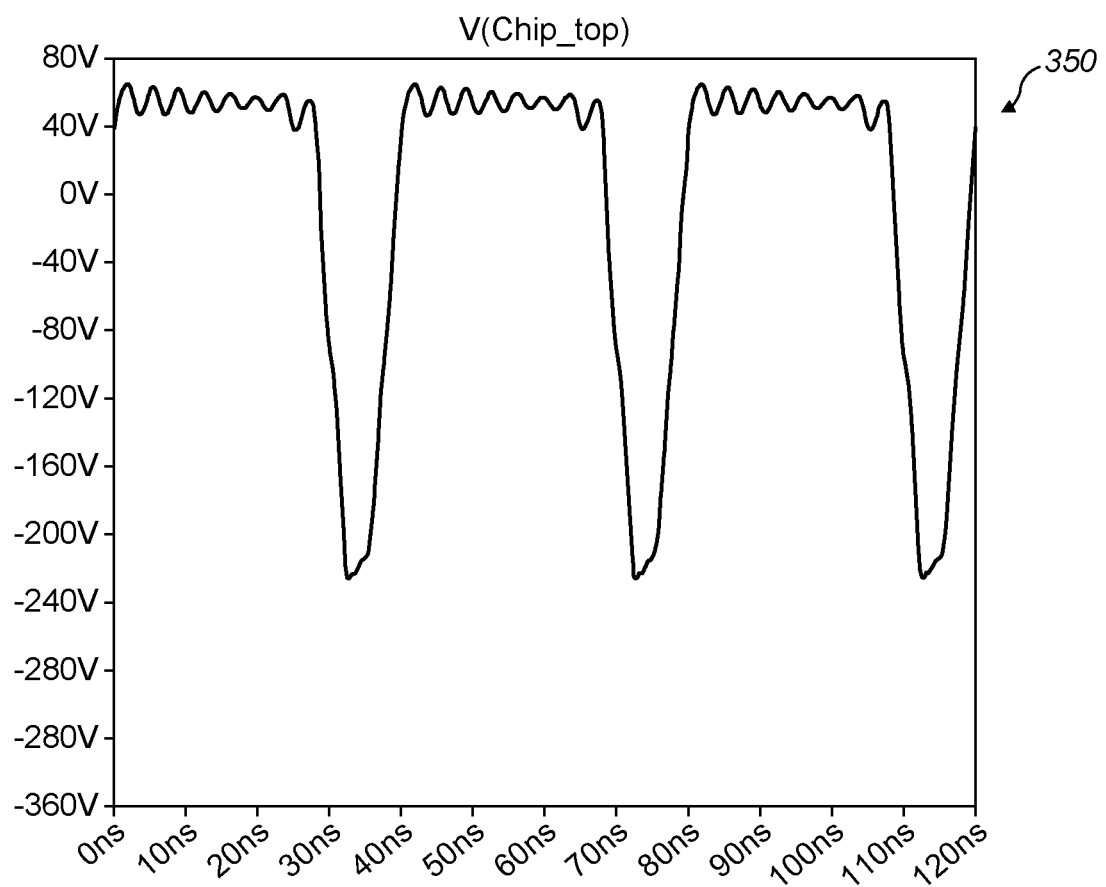

Referring to FIG. 6, there is shown a plot 350 of the second waveform 213 that is supplied to the first terminal 208a of the load 207. The second waveform 213 has the opposite polarity to the first waveform 211 as shown in FIG. 5. The second waveform 213 has peaks of approximately −230V. The peaks in the second waveform 213 correspond with the peaks in the first waveform 211 as shown in FIG. 5 and with the peaks in the voltage waveform applied across the load 207 as shown in FIG. 4.

Figure 7:
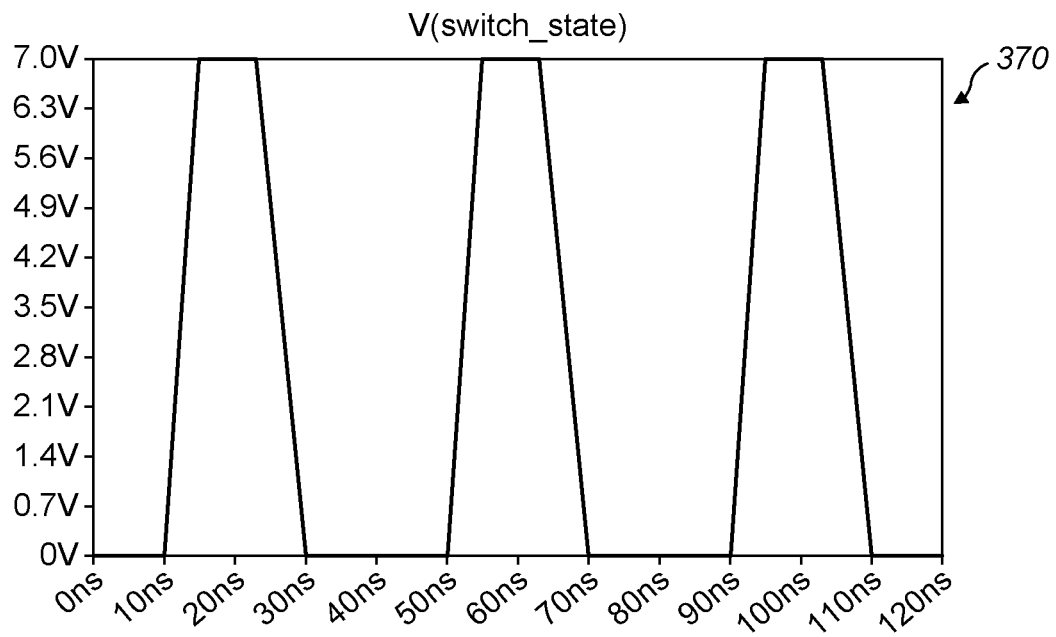
Figure 8:
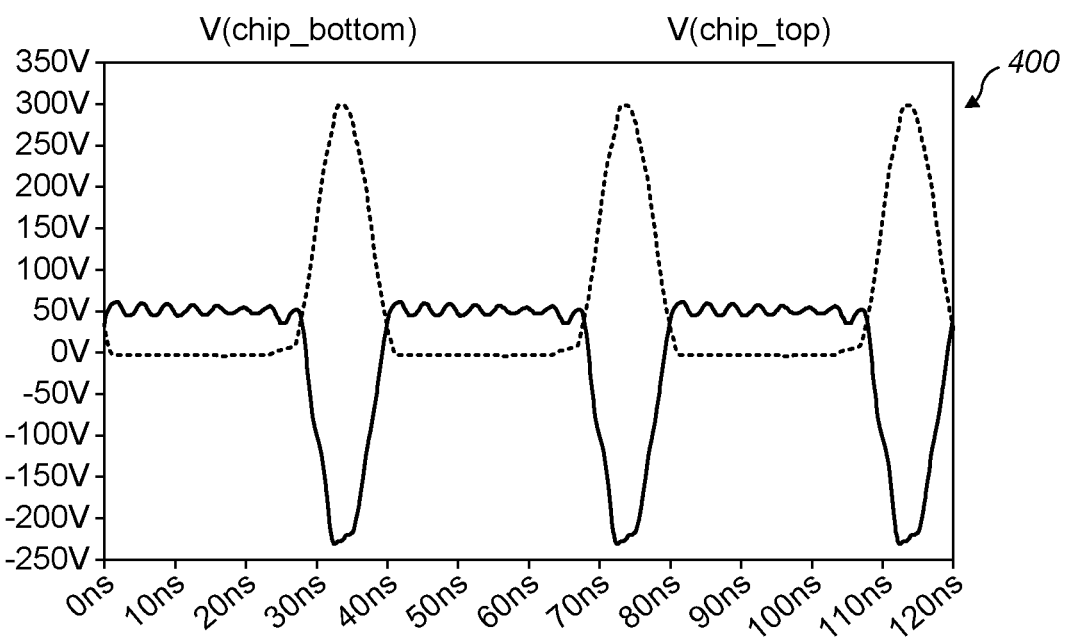

Referring to FIG. 7 there is shown a plot 370 of the voltage across the MOSFET 205. Referring to FIG. 8 there is shown a plot 400 of the first and second waveforms 211, 213 superimposed over one another. In reference to FIGS. 7 and 8, it can be seen that the peaks in the first and second waveforms 211, 213 are a result of the MOSFET 205 transitioning from the ON to the OFF state. In addition, it can be seen that the first and second waveforms 211, 213 are of opposite polarity, and a result cooperate together to produce a larger voltage gain across the load 207. The voltage gain is equal to the sum of the absolute values of the voltages for the first and second waveforms 211, 213.

Figure 9:
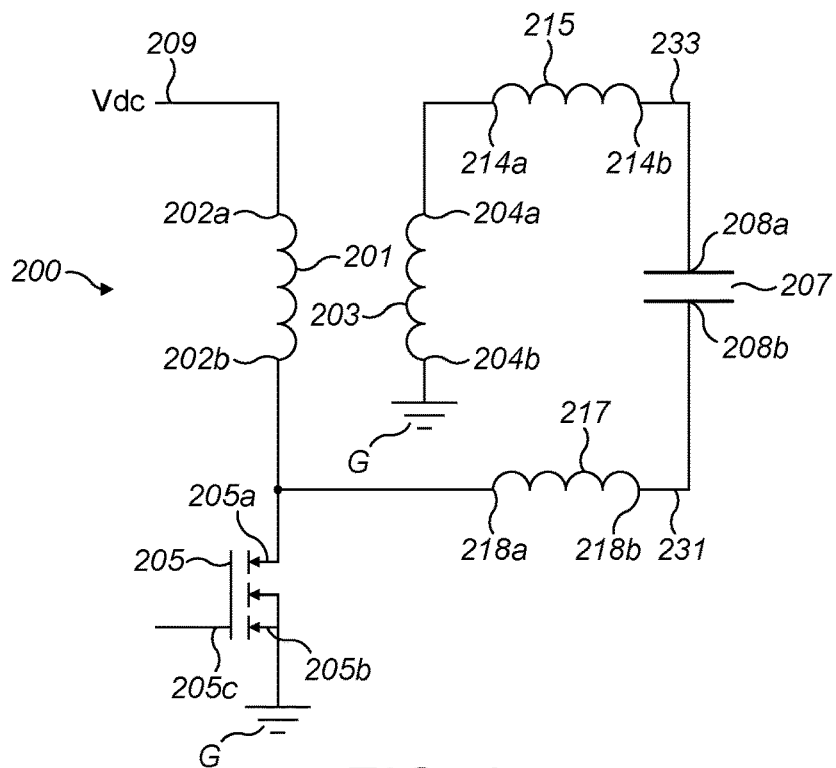
FIG. 9 is a schematic diagram of another example waveform generator according to the first aspect.

Referring to FIG. 9, there is shown another example waveform generator 200 according to the first aspect. In this example, the second output region 233 comprises a third inductor 215. The second inductor 203 is conductively coupled to the third inductor 215 which is in turn conductively coupled to the load 207. The first terminal 204a of the second inductor 203 is conductively coupled to the first terminal 214a of the third inductor 215. The second terminal 214b of the third inductor 215 is conductively coupled to the first terminal 208a of the load 207. In this example, the first output region 231 comprises a fourth inductor 217. The first inductor 201 is conductively coupled to the fourth inductor 217 which is in turn conductively coupled to the load 207. The second terminal 202b of the first inductor 201 is conductively coupled to the first terminal 218a of the fourth inductor 217. The second terminal 218b of the fourth inductor 217 is conductively coupled to the second terminal 208b of the load 207. The other components of the waveform generator 200 of FIG. 9 are the same as the waveform generator 200 of FIGS. 2 and 3. The same reference numerals have been used in FIG. 9.

While not being bound to any particular theory, the added third inductor 215 and/or fourth inductor 217 resonate with the capacitance of the load 207. The addition of the third inductor 215 and/or fourth inductor 217 result in narrower waveform peaks 211, 213 with a higher peak voltage. This results in a higher voltage being generated across the load 207 for the same input DC voltage 209 and MOSFET 205. The waveform generator 200 of FIG. 9 may have a reduced operational frequency range as compared to the waveform generator 200 of FIGS. 2 and 3. In addition, slightly more ringing artefacts on the waveforms may be expected than in the waveform generator 200 of FIGS. 2 and 3.

Figure 10:
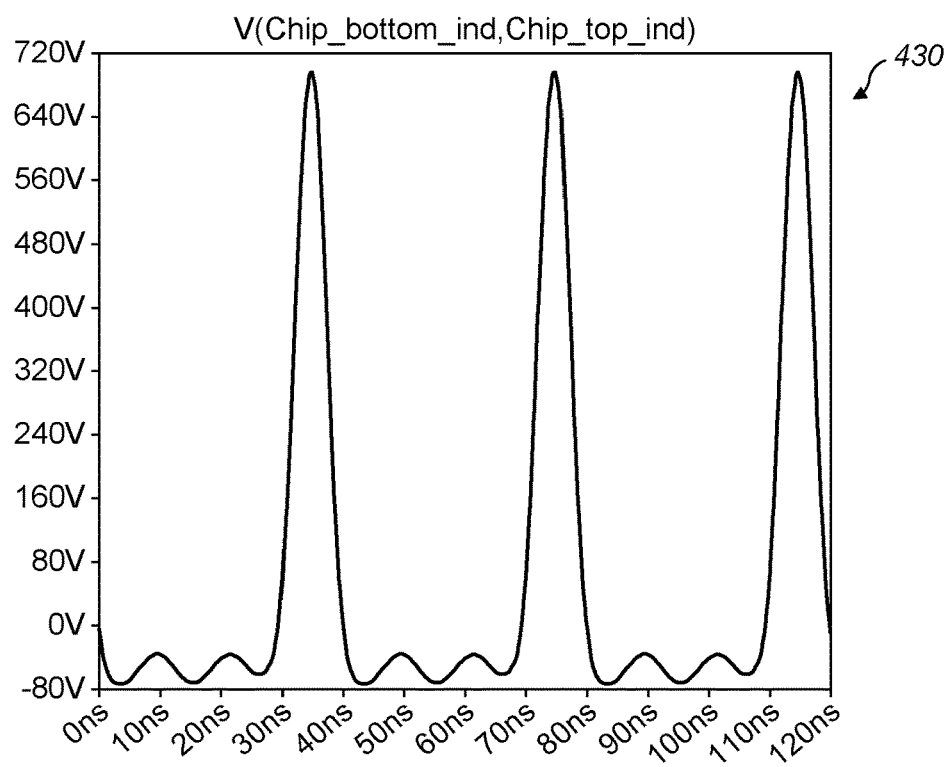
FIGS. 10 to 12 are plots showing example simulation results of the waveform generator according to FIG. 9.
Figure 11:
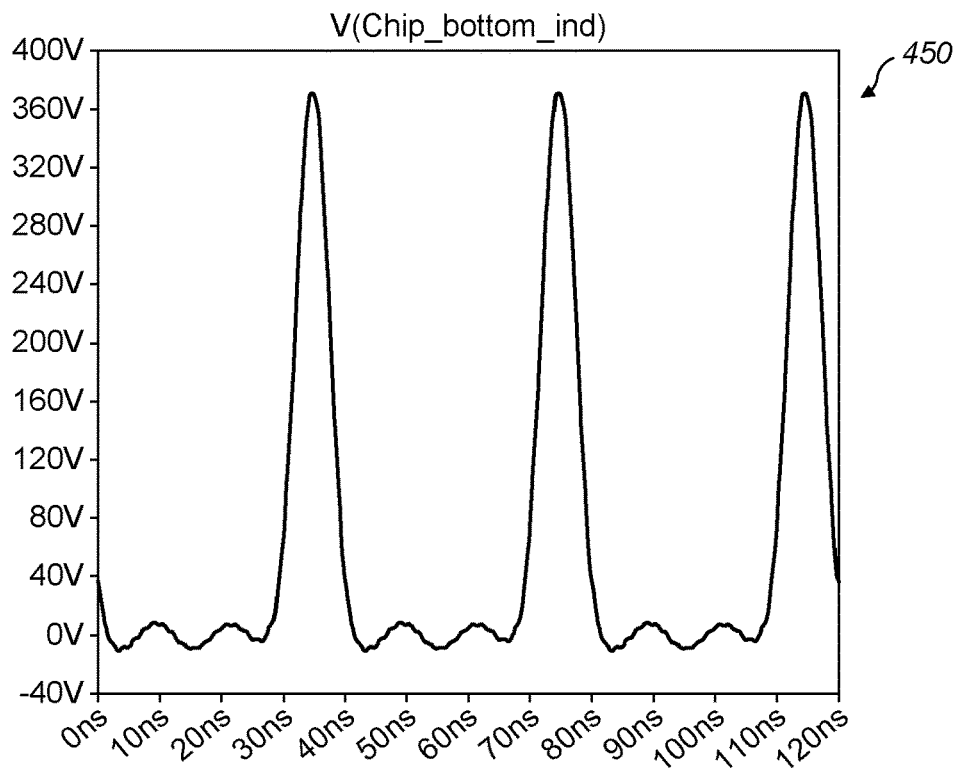
Figure 12:
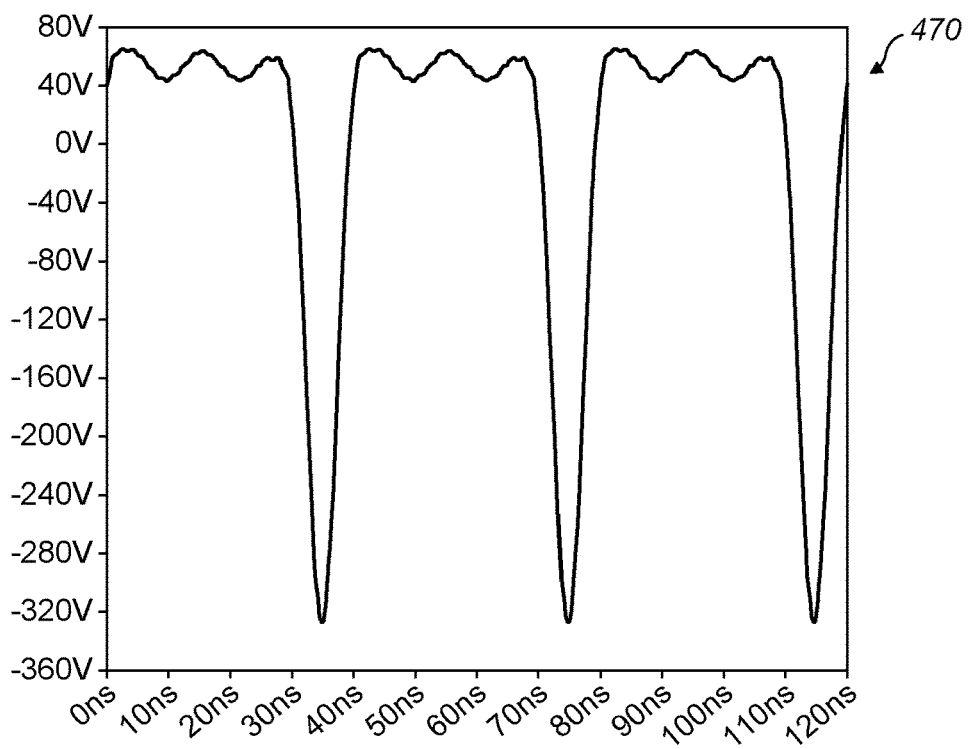

Referring to FIGS. 10 to 12, there are shown the results of a simulation of the waveform generator 200 according to FIG. 9. It will be appreciated that these figures show just an example simulation and are just used to highlight an advantageous operation of the waveform generator 200. In this example simulation, the drive signal applied to the gate 205c of the MOSFET 205 had a frequency of 25 MHz, a duty cycle of 20%, and a peak voltage of 7V. The DC voltage 209 supplied to the first inductor 201 has a value of 60V.

Referring to FIG. 10, there is shown a plot 430 of the voltage waveform applied across the load 207 as a result of the two waveforms 211, 213. The voltage waveform has peaks of approximately 700V and toughs of approximately −60V. It will be appreciated that the peaks of the waveform are higher and narrower than the waveform shown in FIG. 4.

Referring to FIG. 11, there is shown a plot 450 of the first waveform 211 that is supplied to the second terminal 208b of the load 207. The first waveform 211 has peaks of approximately 370V. The peaks in the first waveform 211 correspond with the peaks in the voltage waveform applied across the load 207 shown in FIG. 10.

Referring to FIG. 12, there is shown a plot 470 of the second waveform 213 that is supplied to the first terminal 208a of the load 207. The second waveform 213 has the opposite polarity to the first waveform 211 as shown in FIG. 11. The second waveform 213 has peaks of approximately −330V. The peaks in the second waveform 213 correspond with the peaks in the first waveform 211 as shown in FIG. 11, and with the peaks in the voltage waveform applied across the load 207 as shown in FIG. 10.

Figure 13:
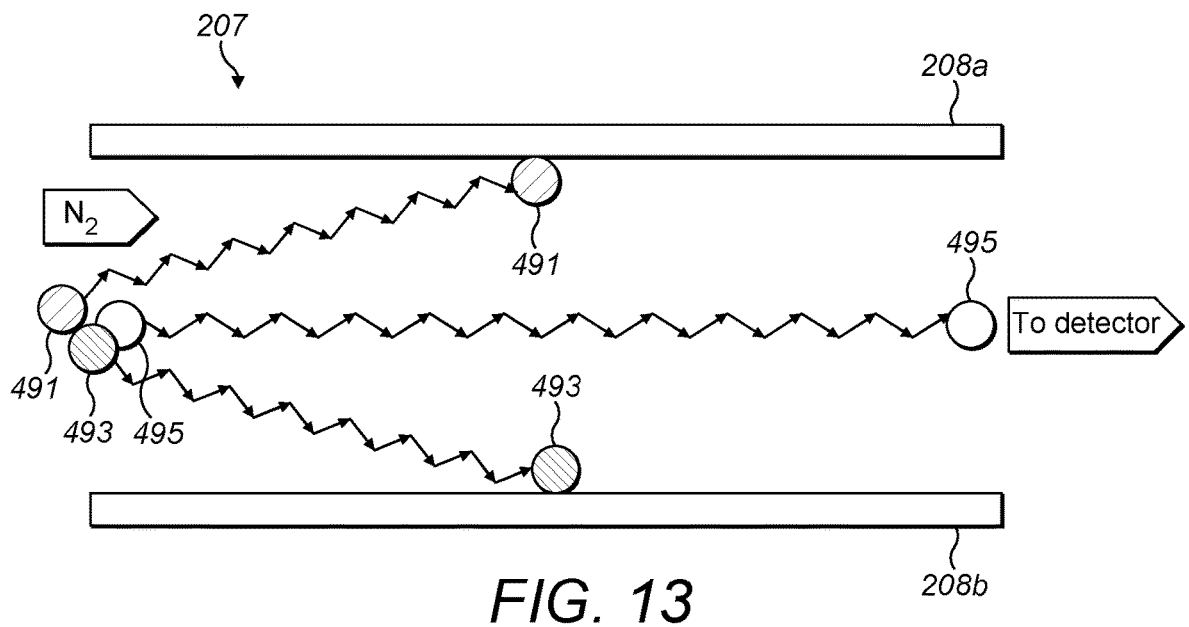

Referring to FIG. 13, there is shown an example load 207. The load 207 is an ion filter device 207, and in particular is a Field Asymmetric Ion Mobility Spectrometer (FAIMS) 207. FAIMS 207 may be used to distinguish charged gaseous molecules according to differences in the speed that the molecules move through a buffer gas under the influence of an oscillating electric field.

The FAIMS 207 comprises two electrodes 208a, 208b in the form of parallel plates 208a, 208b which are spaced apart so as to define a channel 219. The first parallel plate 208a is conductively coupled to the second output region 233 (FIGS. 2, 3 and 9). The second parallel plate 208b is conductively coupled to the first output region 231 (FIGS. 2, 3 and 9). The waveform generator 200 (FIGS. 2, 3, and 9) applies the two waveforms 211, 213 (FIGS. 2, 3 and 9) across the parallel plates 208a, 208b which results in an alternating electric field being applied across the channel 219. In this example, the applied waveforms 211, 213 are asymmetric waveforms, meaning that the duty cycle is less than 50%.

In an example application, vapour from a sample to be analysed is first ionized, and then passed through the channel 219 between the two parallel plates 208a, 208b. During the periods when the waveform applied across the parallel plates 208a, 208b has a positive polarity, the ions will drift in one direction at a velocity based on the ions individual mobility in that electric field. As the applied waveform reverses in polarity, the ions change direction and speed based on the new electric field conditions. As the mobility of the ions during the two parts of the waveform is rarely equal, there is usually a net drift towards one of the parallel plates 208a, 208b. In the FAIMS 207, this net drift is corrected for by applying an additional DC voltage, known as the compensation voltage, focusing specific ions through the FAIMS 207 to the detector.

In the example shown in FIG. 13, it can be seen that three ions 491, 493, 495 are introduced into the channel 219 between the two parallel plates 208a, 208b. The ions 491, 493, 495 follow a generally saw-tooth trajectory due to the application of the alternating waveform to the two parallel plates 208a, 208b. Due to the different mobility behaviours of the three ions 491, 493, and 495 under the influence of the electric field, and in particular due to how the mobility of the ions 491, 493, and 495 vary with the electric field strength, each of three ions 491, 493, 495 follow a different trajectory in the channel 219. The trajectory of two of the ions 491, 493 collide with the parallel plates 208a, 208b. The ion 495 has the appropriate compensation voltage applied, meaning that its trajectory traverses the channel 219 of the FAIMS 207. By scanning through a range of magnitudes of waveforms applied to the parallel plates 208a, 208b, and a range of compensation voltages, and by recording the ion current at each magnitude/compensation voltage value, the FAIMS 207 can be used to generate information about the different compounds present in a sample.

Figure 14:
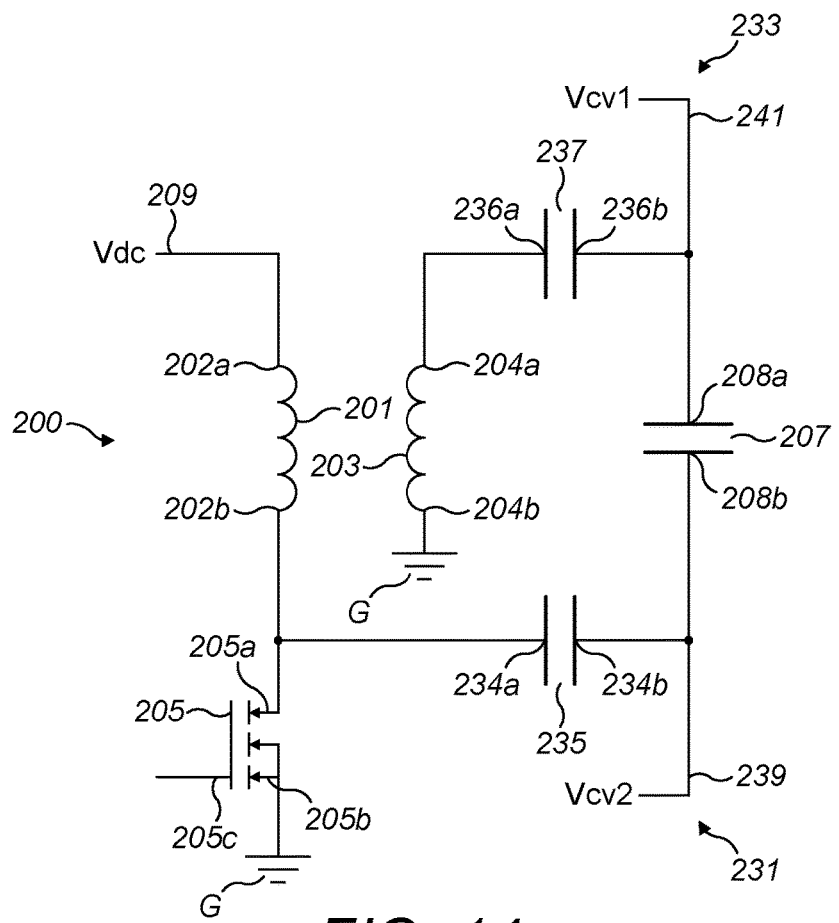
FIG. 14 is a schematic diagram of another example waveform generator according to the first aspect.

Referring to FIG. 14, there is shown another example waveform generator 200. In this example, a compensation voltage is applied to the FAIMS 207. The first terminal 208a of the FAIMS 207 is conductively coupled to a first DC compensation voltage source 241. The second terminal 208b of the FAIMS 207 is conductively coupled to a second DC compensation voltage source 239. In this way, a DC compensation voltage is applied across the FAIMS 207. The first output region 231 comprises a first capacitor 235. The first capacitor 235 has a first terminal 234a conductively coupled to the second terminal 202b of the first inductor 201, and a second terminal 234b conductively coupled to the second terminal 208b of the FAIMS 207. The second output region 233 comprises a second capacitor 237. The second capacitor 237 has a first terminal 236a conductively coupled to the first terminal 204a of the second inductor 203, and a second terminal 236b conductively coupled to the first terminal 208a of the FAIMS 207. The other components of the waveform generator 200 of FIG. 14 are the same as the waveform generator 200 of FIGS. 2, 3, and 9. The same reference numerals have been used in FIG. 14.

The first capacitor 235 and the second capacitor 237 may be selected such that they do not have a significant effect on the waveform voltage generation. For example, the first and second capacitors 235, 237 may have a high capacitance of 10 nF or more so as to cause only a small voltage drop. The first and second capacitors 235, 237 are provided to block DC current flowing to ground G via the MOSFET 205 or the second inductor 203 as a result of the applied DC compensation voltages. As the first and second capacitors 235, 237 are arranged in series with the FAIMS 207, and have high capacitance values, they have a minimal effect on the performance of the waveform generator 200.

The first and second capacitors 235, 237 may be combined with the third and fourth inductors 215, 217. That is, the first output region 231 may comprise the fourth inductor 217 and the first capacitor 235 connected in series. Either the first capacitor 235 or the fourth inductor 217 may be conductively coupled to the second terminal 208b of the load 207. In addition, the second output region 233 may comprise the third inductor 215 and the second capacitor 237 connected in series. Either the second capacitor 237 or the third inductor 215 may be conductively coupled to the first terminal 208a of the load 207.

The present invention is not limited to waveform generators 200 for FAIMS 207. Instead, it will be appreciated that the waveform generator 200 of the first aspect is ideally suited for the generation of waveforms for FAIMS 207. This is at least because the waveform generator 200 according to the first aspect is able to generator stable, high peak voltage waveforms, with a high frequency, and with sharp transitions between the troughs and the peaks of the waveform. In addition, as the waveform generator 200 of the first aspect can be operated at lower power due to reduced parasitic effects, it is ideally suited for battery operated, and portable, FAIMS 207.

Figure 15:
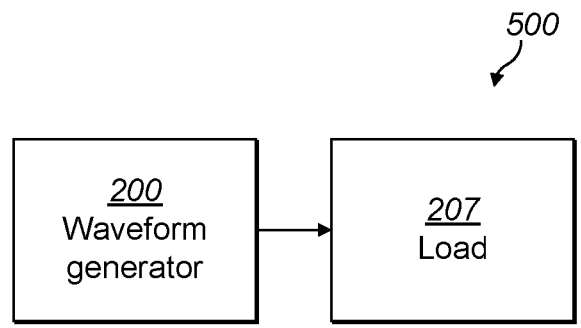
FIG. 15 is a schematic diagram of an example system according to the second aspect.

Referring to FIG. 15, there is shown an example system according to the second aspect and indicated generally by the reference numeral 500. The system 500 comprises the waveform generator 200 and the load 207, which may be a FAIMS 207.

Figure 16:
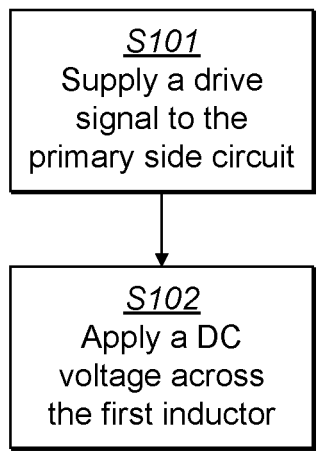
FIG. 16 is a schematic diagram of an example method according to the third aspect.

Referring to FIG. 16, there is shown an example method according to the third aspect for driving a waveform generator 200 according to the first aspect.

In step S101, the method comprises supplying a drive signal to the primary side circuit. The drive signal may be supplied to switch 205 (FIGS. 2, 3 9, and 14), and may, in particular, be applied to the gate 205c of the MOSFET 205 (FIGS. 3, 9 and 14). The drive signal may have a duty cycle of less than 50%.

In step S102, the method comprises applying a DC voltage across the first inductor 201 (FIGS. 2, 3, 9 and 14). This may comprise increasing the DC voltage in increments from a starting DC voltage to a target DC voltage.

An example method of driving the waveform generator 200 (FIGS. 2, 3 9, and 14) when the waveform generator 200 is used to supply waveforms to a FAIMS 207 will now be explained.

In this example, the drive signal supplied to the primary side circuit has a frequency of 25 MHz, a duty cycle of 25% and a peak voltage of 6V.

Initially, the DC voltage supplied to the first inductor 201 has a magnitude 0 V. During the time the magnitude is 0V, the compensation voltage is scanned through a range of values to allow different ions to pass through the channel 219 (FIG. 13). Measurements are taken for each compensation voltage.

The DC voltage is then increased to 10 V. During the time the magnitude is 10V, the compensation voltage is again scanned through the range of values. Measurements are taken for each compensation voltage.

The DC voltage is increasing in increments of 10V until the target voltage, which in this case is 60V is reached. During each increment, the compensation voltage is scanned through the range of values and measurements are taken.

In this way, the method may drive the waveform voltage to generate a range of compensation voltages during each increment of the applied DC voltage. This allows for the FAIMS 207 to identify different ions in a sample.

In another example, increasing the DC voltage in increments may comprise increasing the DC voltage in increments during a number of cycles until the target DC voltage is reached. In each cycle, the DC voltage may be increased in increments from an initial DC voltage to a final DC voltage. The initial DC voltage and the final DC voltage may be increased after each cycle. For example, a first cycle may be 0, 10, 20, 30 and 40V, and a second cycle may be 1, 11, 21, 31 and 41V, subsequent cycles will follow the same pattern until the desired target DC voltage (e.g. 60V) is reached. In this example, the cycling of the DC voltage helps to minimise the effect on the spectra from any systematic noise or drift. This may be as a result of charge build-up on the FAIMS electrodes 208a, 208b.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

In summary, there is provided a waveform generator 200 configured to generate two waveforms 211, 213 of opposite polarity so as to provide a voltage gain across a load 207. The waveform generator 200 has a primary side circuit comprising a first inductor 201. The waveform generator 200 has a secondary side circuit comprising a second inductor 203, a first output region 231 conductively coupled to the load 207, and a second output region 233 conductively coupled to the load 207. The second inductor 203 is inductively coupled to the first inductor 201. The first inductor 201 is conductively coupled to the first output region 231 so as to supply a first 211 of the two waveforms 211, 213 to the load 207. The second inductor 203 is conductively coupled to the second output region 233 so as to supply a second 213 of the two waveforms 211, 213 to the load 207. A system 500 incorporating the waveform generator 200, and a method of driving the waveform generator 200 are also provided.

Although a few preferred embodiments of the present invention have been shown and described, it will be appreciated by those skilled in the art that various changes and modifications might be made without departing from the scope of the invention, as defined in the appended claims.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

The invention claimed is:

1. A waveform generator configured to generate two waveforms of opposite polarity so as to provide a voltage gain across a load, the waveform generator comprising:
    a primary side circuit comprising a first inductor; and
    a secondary side circuit comprising a second inductor inductively coupled to the first inductor, a first output region conductively coupled to the load, and a second output region conductively coupled to the load,
    wherein the first inductor is arranged to be conductively coupled to the first output region so as to supply a first of the two waveforms to the load,
    wherein the second inductor is arranged to be conductively coupled to the second output region so as to supply a second of the two waveforms to the load,
    wherein the first output region comprises a first capacitor, the first capacitor having a first terminal conductively coupled to a second terminal of the first inductor and a second terminal conductively coupled to a second terminal of the load, and
    wherein the second output region comprises a second capacitor, the second capacitor having a first terminal conductively coupled to a first terminal of the second inductor and a second terminal conductively coupled to a first terminal of the load.

2. The waveform generator as claimed in claim 1, wherein the two waveforms are continuous waveforms both having the same predetermined frequency.

3. The waveform generator as claimed in claim 1, wherein the two waveforms are supplied to the load at substantially the same time.

4. The waveform generator as claimed in claim 1, wherein the two waveforms have a frequency of between 10 and 50 MHz.

5. The waveform generator as claimed in claim 1, wherein the two waveforms have a peak voltage with a magnitude of between 0.5 and 1500 V.

6. The waveform generator as claimed in claim 1, wherein the two waveforms have a duty cycle of less than 50%.

7. The waveform generator as claimed in claim 1, wherein a first terminal of the first inductor is conductively coupled to a DC voltage source, and the second terminal of the first inductor is conductively coupled to the first output region.

8. The waveform generator as claimed in claim 7, further comprising a switch conductively coupled to the second terminal of the first inductor, the switch being arranged to be activated by a drive signal so as to control the generation of the two waveforms.

9. The waveform generator as claimed in claim 8, wherein the switch is a Field Effect Transistor (FET) including a drain and a gate, wherein the second terminal of the first inductor is conductively coupled to the drain of the FET, and wherein the gate of the FET is arranged to receive the drive signal.

10. The waveform generator as claimed in claim 8, further comprising a controller arranged to supply the drive signal to the switch so as to control the generation of the two waveforms.

11. The waveform generator as claimed in claim 8, wherein the waveform generator is arranged to generate the two waveforms as a result of the switch transitioning from an ON state to an OFF state.

12. The waveform generator as claimed in claim 1, wherein the first terminal of the second inductor is conductively coupled to the second output region and a second terminal of the second inductor is conductively coupled to ground.

13. The waveform generator as claimed in claim 1, wherein the second output region is arranged to be conductively coupled to the first terminal of the load, and wherein the first output region is arranged to be conductively coupled to the second terminal of the load.

14. The waveform generator as claimed in claim 13, wherein the first terminal of the load comprises a first electrode, and wherein the second terminal of the load comprises a second electrode.

15. The waveform generator as claimed in claim 1, wherein the second output region comprises a third inductor, and wherein the second inductor is coupled to the third inductor.

16. The waveform generator as claimed in claim 1, wherein the first output region comprises a fourth inductor, and wherein the first inductor is coupled to the fourth inductor.

17. The waveform generator as claimed in claim 1, wherein the load is an ion filter device.

18. The waveform generator as claimed in claim 17, wherein the ion filter device is a Field Asymmetric Ion Mobility Spectrometer (FAIMS).

19. The waveform generator as claimed in claim 1, wherein the first inductor and the second inductor are arranged such that when a voltage of a first polarity is applied across the first inductor, a voltage of the same polarity to the first polarity is induced in the second inductor.

20. A system comprising:
a load; and
a waveform generator as claimed in claim 1, configured to generate two waveforms of opposite polarity so as to provide a voltage gain across the load.

21. A method of driving a waveform generator as claimed in claim 1, the method comprising:
supplying a drive signal to the primary side circuit; and
applying a DC voltage across the first inductor.

22. The method as claimed in claim 21, wherein said applying the DC voltage across the first inductor comprises increasing the DC voltage in increments from a starting DC voltage to a target DC voltage.

23. The method as claimed in claim 22, wherein said increasing the DC voltage in increments comprises increasing the DC voltage in increments during a number of cycles until the target DC voltage is reached, wherein in each cycle, the DC voltage is increased in increments from an initial DC voltage to a final DC voltage, and wherein the initial DC voltage and the final DC voltage are increased after each cycle.

\* \* \* \* \*